United States Patent [19]
Eikleberry et al.

[11] Patent Number: 5,789,078
[45] Date of Patent: Aug. 4, 1998

[54] REINFORCEMENT MAT

[75] Inventors: Sheri L. Eikleberry, Gahanna; Frank J. Macdonald, Granville; Margaret M. Woodside, Pickerington, all of Ohio

[73] Assignee: Owens-Corning Fiberglas Technology, Inc., Summit, Ill.

[21] Appl. No.: 713,318

[22] Filed: Sep. 13, 1996

[51] Int. Cl.⁶ ............................................... D02G 3/00
[52] U.S. Cl. .................... 428/373; 428/374; 428/375; 428/380; 428/397; 442/392
[58] Field of Search ........................... 156/172, 173, 156/175, 180, 203, 244, 273, 275; 428/373, 374, 375, 380, 397; 442/392

[56] References Cited

U.S. PATENT DOCUMENTS

| | | |
|---|---|---|
| 2,610,957 | 9/1952 | Steinman et al. |
| 3,041,230 | 6/1962 | Diehl. |
| 3,930,091 | 12/1975 | Lewis et al. |
| 3,934,064 | 1/1976 | Lowthian. |
| 4,211,818 | 7/1980 | Ackley. |
| 4,220,496 | 9/1980 | Carley et al. |
| 4,220,497 | 9/1980 | Carley. |
| 4,690,850 | 9/1987 | Fezio. |
| 4,800,114 | 1/1989 | Cichanowski. |
| 4,851,274 | 7/1989 | D'Elia. |
| 4,851,277 | 7/1989 | Valkenburg et al. |
| 4,870,887 | 10/1989 | Tresselar et al. |
| 4,935,077 | 6/1990 | Ellers. |
| 5,181,330 | 1/1993 | Schoch. |
| 5,445,693 | 8/1995 | Vane. |
| 5,556,690 | 9/1996 | Katz. |
| 5,569,344 | 10/1996 | Grimnes. |

*Primary Examiner*—Richard Weisberger
*Attorney, Agent, or Firm*—C. Michael Gegenheimer; Inger H. Eckert

[57] ABSTRACT

A mat is provided which comprises a plurality of strands, each including reinforcing fibers and polymeric material. First portions of the strands are angularly positioned at an angle relative to second portions of the strands and are joined to the second portions via the polymeric material. Also provided is a method for forming the mat.

8 Claims, 9 Drawing Sheets

REINFORCEMENT MAT

CROSS REFERENCE TO RELATED APPLICATION

This application is related to contemporaneously filed U.S. patent application Ser. No. 08/713,319, titled "PROCESS AND APPARATUS FOR MAKING A REINFORCEMENT MAT," by Ronald G. Krueger, having attorney docket No. 24084A, the disclosure of which is hereby incorporated by reference.

TECHNICAL FIELD

This invention is directed to a reinforcement mat.

BACKGROUND OF THE INVENTION

Mats made from reinforcing materials such as glass fibers are known. Such mats are commonly used in composite products, such as printed circuit boards, skis, rail car tanks, boat hulls and the like. Typically, such mats are formed via a knitting or weaving operation. However, knitting and weaving operations are quite complex and throughput rates are low. Hence, while such knitting and weaving processes may be effective, they are time consuming and inefficient and, thus, expensive.

Accordingly, there is a need in the art for a more efficient and more cost effective process for making composite product reinforcement mats.

SUMMARY OF THE INVENTION

This need is met by the present invention whereby a reinforcement mat is provided. The mat formed in accordance with the present invention may be used in the manufacture of composite products via molding, pultrusion, filament winding or like processes.

In accordance with a first aspect of the present invention, a mat is provided for use as a reinforcement in a composite product. The mat comprises a plurality of strands, each including reinforcing fibers and polymeric material. First portions of the strands are angularly positioned relative to second portions of the strands and are joined to the second portions via the polymeric material.

Preferably, the reinforcing fibers are selected from the group consisting of S-glass fibers, E-glass fibers, graphite fibers, aramid fibers such as those sold under the trademark Kevlar®, metallic fibers and ceramic fibers.

In accordance with one embodiment of the present invention, the polymeric material may comprise polymer fibers which are commingled with the reinforcing fibers. The polymer fibers may be selected from the group consisting of polyamide fibers, polypropylene fibers, polyester fibers, polyethylene fibers, and polyphenylene sulfide fibers. Fibers formed from any other fiberizable thermoplastic polymer may also be used.

In accordance with another embodiment of the present invention, the polymeric material comprises a polymer coated on at least a portion of the reinforcing fibers. Preferably, the polymer coating comprises a coating of thermoplastic material.

Preferably, the first strand portions form with a first horizontal axis an angle of from about 3° to about 87° and the second strand portions form with a second horizontal axis parallel to the first horizontal axis an angle of from about −3° to about −87°. More preferably, the first strand portions form with a first horizontal axis an angle of from about 30° to about 60° and the second strand portions form with a second horizontal axis parallel to the first horizontal axis an angle of from about −30° to about −60°.

The first and second strand portions are not woven or knitted together. Instead, the polymeric material incorporated into the strands is melted via a device, e.g., heated rolls or an ultra-sonic device, such that adjacent strand portions bond or fuse to one another.

In accordance with a second aspect of the present invention, a process is provided for forming a reinforcement mat. The process comprises the steps of: providing a plurality of composite strands, each including reinforcing fibers and polymeric material; positioning first portions of the composite strands at an angle relative to second portions of the composite strands; and joining the first and second strand portions together via the polymeric material incorporated into those strands.

Preferably, the reinforcing fibers are selected from the group consisting of S-glass fibers, E-glass fibers, graphite fibers, aramid fibers, metallic fibers and ceramic fibers.

In accordance with one embodiment of the present invention, the polymeric material comprises polymer fibers which are commingled with the reinforcing fibers. In accordance with another embodiment of the present invention, the polymeric material comprises a polymer coating on the strands.

The positioning step preferably comprises the steps of positioning the first strand portions such that they form with a first horizontal axis an angle of from about 3° to about 87° and positioning the second strand portions such that they form with a second horizontal axis parallel to the first horizontal axis an angle of from about −3° to about −87°. More preferably, the positioning step comprises the steps of positioning the first strand portions such that they form with a first horizontal axis an angle of from about 30° to about 60° and positioning the second strand portions such that they form with a second horizontal axis parallel to the first horizontal axis an angle of from about −30° to about −60°.

The joining step preferably comprises the step of heating the first and second strand portions to a sufficient degree to cause the polymeric material incorporated into the strands to soften or melt and flow such that the polymeric material in the adjacent strands bonds or fuses together to join the adjacent strands to one another and, hence, form a mat. Preferably, the joining step further comprises the step of cooling the first and second strand portions such that the polymeric material solidifies.

The joining step preferably takes place without a weaving or knitting step being performed.

The first strand portions define a first plane and the second strand portions define a second plane which is generally parallel to the first plane.

In accordance with a third aspect of the present invention, a mat is provided for use as a reinforcement in a composite product. The mat comprises a plurality of composite strands each including reinforcing fibers and first polymeric material. The mat further includes second polymeric material. First portions of the strands are angularly positioned relative to second portions of the strands and are joined to the second portions via the second polymeric material. The second polymeric material may comprise fibers formed by any fiberizable thermoplastic material or thermoplastic film material. It is also contemplated that the second polymeric material may comprise polymeric material incorporated into commingled glass and polymer fiber strands or polymeric material coated onto reinforcing fibers. The second polymeric material may extend in the machine direction. Preferably, the second thermoplastic material has a melting temperature which is below the melting temperature of the first thermoplastic material.

The objectives, features, and advantages of the resent invention will become apparent upon consideration of he detailed description and the appended drawings.

DETAILED DESCRIPTION AND PREFERRED EMBODIMENTS OF THE INVENTION

Figure 1:
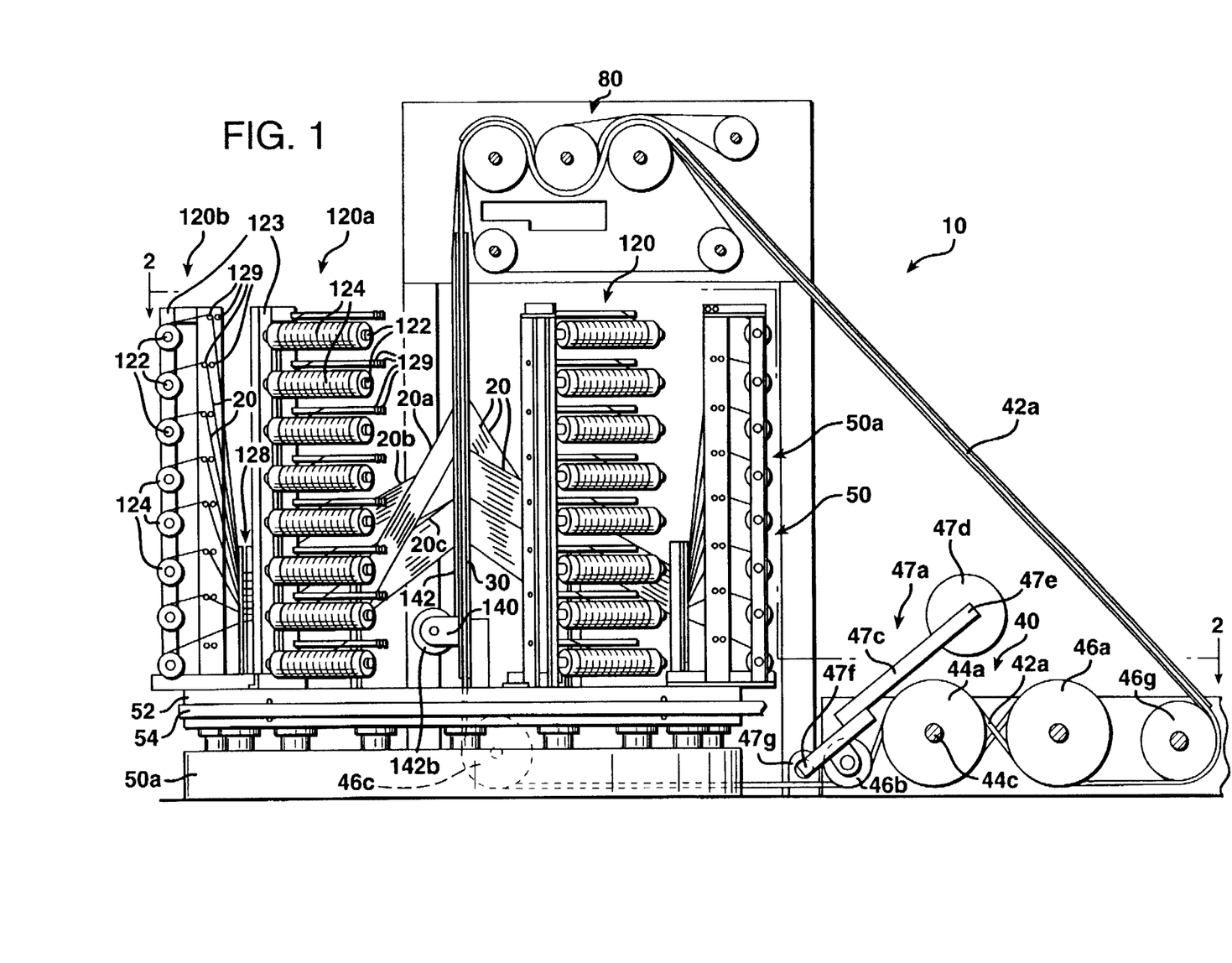
FIG. 1 is a side view of a mat forming apparatus constructed in accordance with the present invention.
Figure 2:
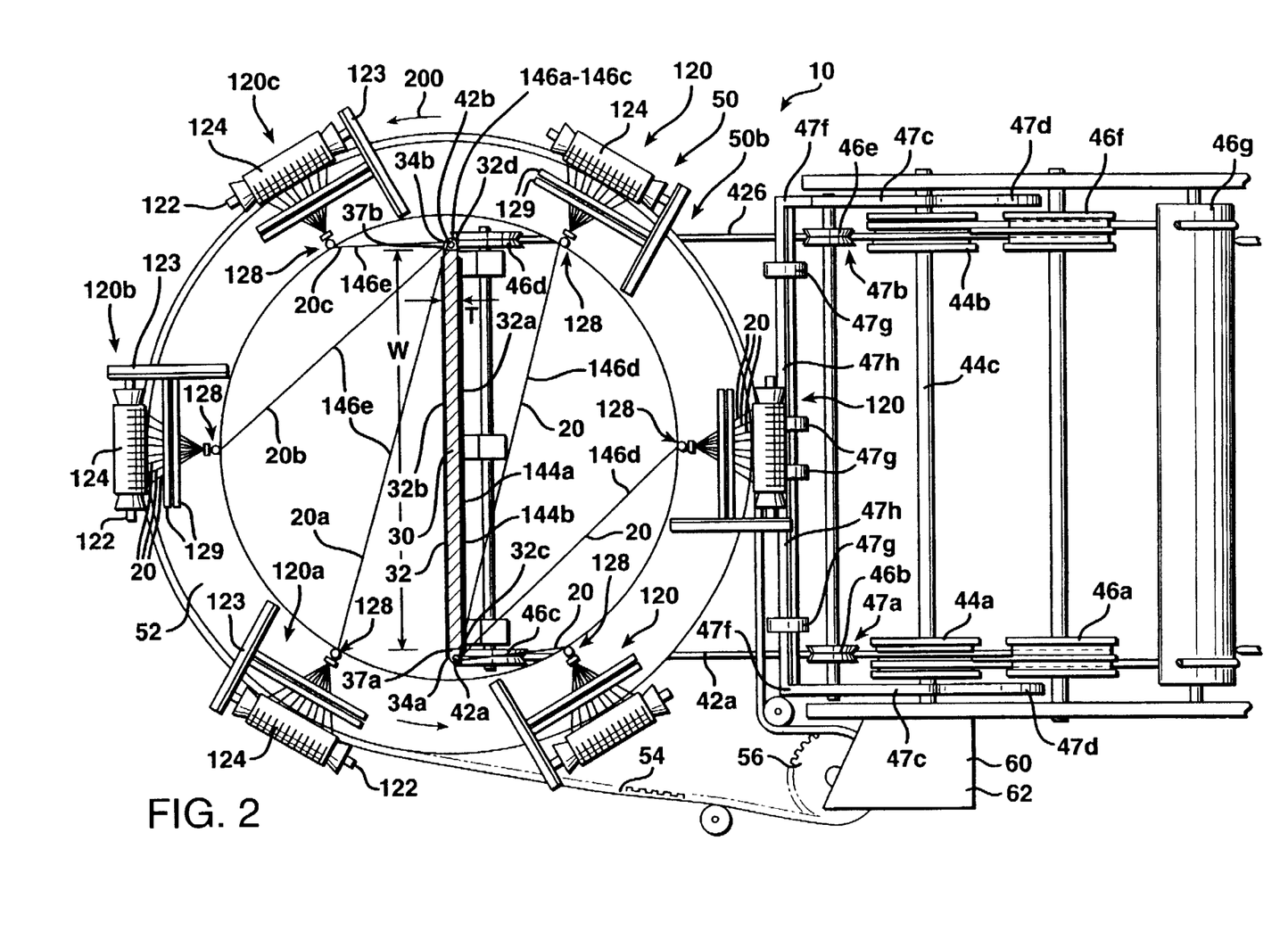
FIG. 2 is a view taken along view line 2—2 in FIG. 1.
Figure 3:
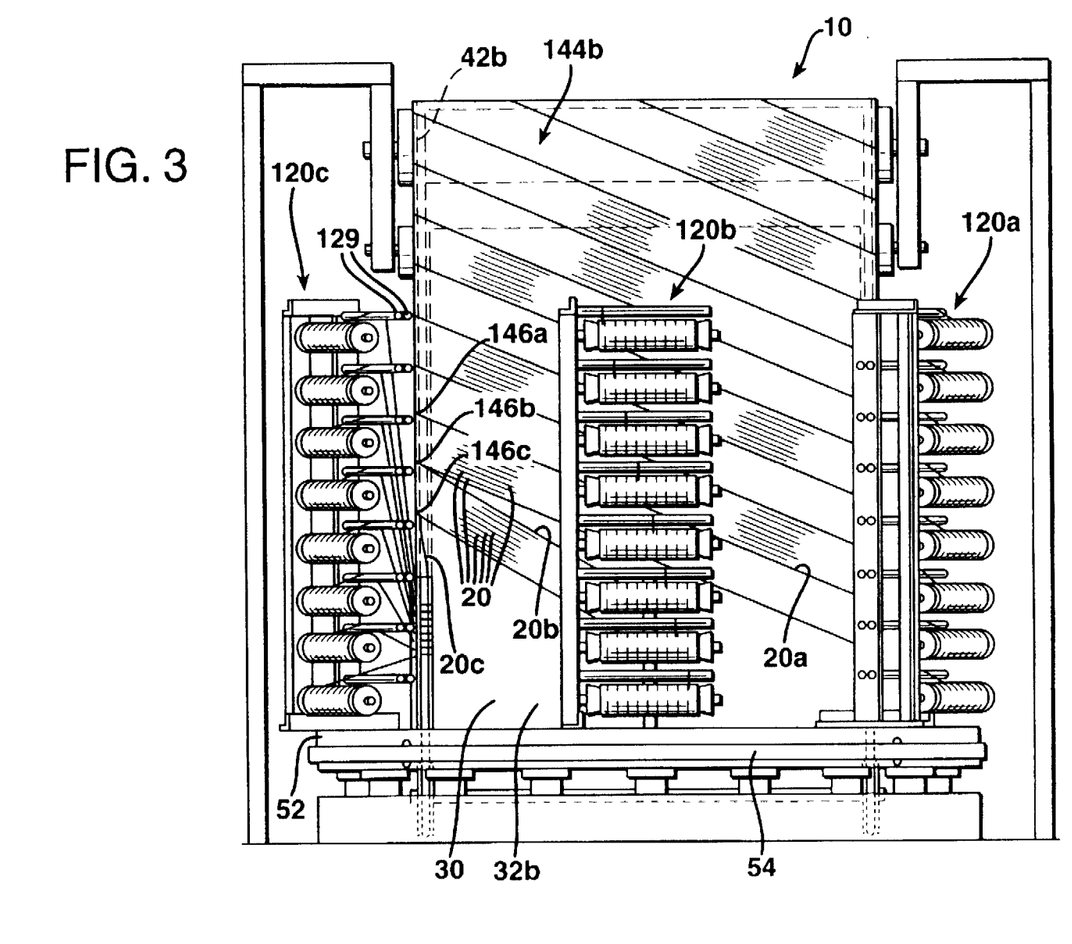
FIG. 3 is a front view of the apparatus shown in FIG. 1.

An apparatus 10 constructed in accordance with the present invention for forming a mat from a plurality of strands of material 20 is shown in FIGS. 1-3. Preferably, the strands 20 are reinforcing strands such that a reinforcement mat 100 is formed, see FIGS. 5 and 9-11. Such a mat 100 may be used in the manufacture of fiber reinforced composite products via molding, pultrusion, filament winding or like processes.

The forming apparatus 10 comprises a form or mandrel 30 about which a plurality of the strands of material 20 are wrapped. The forming apparatus 10 also includes a conveying apparatus 40, a strand dispensing frame 50b, a drive apparatus 60 and separating apparatus 70, see FIGS. 1, 2 and 5.

In the illustrated embodiment, the form 30 comprises a generally vertically positioned, fixed, flat steel plate 32 having generally planar first and second sides 32a and 32b and first and second narrow outer edges 32c and 32d, see FIG. 2. The plate 32 may have a width W equal to approximately 50 inches (1.275 m) and thickness T equal to approximately 0.16 inch (4 mm).

The conveying apparatus 40 includes a pair of conveyor elements, first and second endless cables 42a and 42b in the illustrated embodiment, which travel along first and second sections 34a and 34b of the form 30. In the illustrated embodiment, the first and second sections 34a and 34b are defined by first and second polymeric conveyor element guides 37a and 37b which are located along the first and second outer edges 32c and 32d of the plate 32. The guides 37a and 37b are provided with grooves, e.g., V-shaped or oval grooves, which receive the endless cables 42a and 42b. If guides 37a and 37b are not provided, the first and second outer edges 32c and 32d of the plate 32 may be shaped to receive the cables 42a and 42b and, hence, would define the first and second sections 34a and 34b of the form 30. As will be discussed more explicitly below, the strands 20 are also wrapped about the cables 42a and 42b such that the wrapped strands 20 are moved by the cables 42a and 42b along the form 30 and away from the form 30 to a combining station 80, see FIG. 1, and then to a separating station 90, see FIG. 5.

The conveying apparatus 40 further comprises drive rollers 44a and 44b which are connected to a conventional electric drive motor 62 via a shaft 44c and a gear mechanism (not shown). The drive motor 62 forms part of the drive apparatus 60. To prevent cable slippage, the cable 42a is wrapped twice about the drive roller 44a and the cable 42b is wrapped twice about the drive roller 44b, see FIGS. 1 and 2. The conveying apparatus 40 also includes a plurality of idler rollers 46a–46g which together with the drive rollers 44a and 44b, the first and second sections 34a and 34b of the form 30 and first, second and third rolls 160, 162 and 164 at the combining station 80 define endless paths for the cables 42a and 42b.

Idler rollers 46b and 46e form part of tensioning devices 47a and 47b which act to apply tension to the cables 42a and 42b. Each of the tensioning devices 47a and 47b comprises a pivotable arm 47c having a weight 47d coupled to a first end 47e which is opposite to an end 47f which is fixedly connected to a transverse member 47h. The transverse member 47h is pivotably connected to fixed supports 47g.

The strand dispensing frame 50b comprises a circular carousel 50. The carousel 50 is positioned around the form 30 and is capable of moving about the form 30. The carousel 50 includes a lower, circular base 52 which is rotatably mounted to a fixed base 50a via bearings (not shown), see FIG. 1. The circular base 52 is provided with a plurality of drive teeth (not shown) which extend about the entire outer circumference of the circular base 52. The circular base drive teeth intermesh with teeth on an endless drive belt 54 such that rotation of the endless drive belt 54 effects rotation of the carousel 50, see FIG. 2. Rotation of the endless drive belt 54 is effected via a drive pinion 56 connected to a gear reducer (not shown) which, in turn, is connected to the electric motor 62.

In the embodiment illustrated in FIGS. 1 and 2, the carousel 50 further comprises six creels 120 or strand supply stations. It is also contemplated that less than six or more than six creels 120 may be used. Each creel 120 comprises a plurality of horizontal support arms 122, eight in the embodiment illustrated in FIGS. 1 and 2, which are fixedly connected to a vertical support 123. The vertical supports 123 are fixedly connected to the circular base 52. Each horizontal support arm 122 carries a single package 124 which, in the illustrated embodiment, has a single strand 20 extending from it.

An eyelet array guide device 128 is associated with each creel 120 and is fixedly connected to the circular base 52 so as to rotate with the base 52. Each guide device 128 is positioned between its associated creel 120 and the form 30 and has a plurality of eyelets 128a, see FIG. 6, for receiving the strands 20 extending from the packages 124 mounted to its associated creel 120. In the embodiment illustrated in FIG. 1, each of the uppermost strands 20 pass through a pair of guide arms 129 before passing through the guide device 128. From the guide devices 128, the strands 20 extend to the form 30 so as to be wrapped about the form 30 as the carousel 50 rotates.

Figure 6:
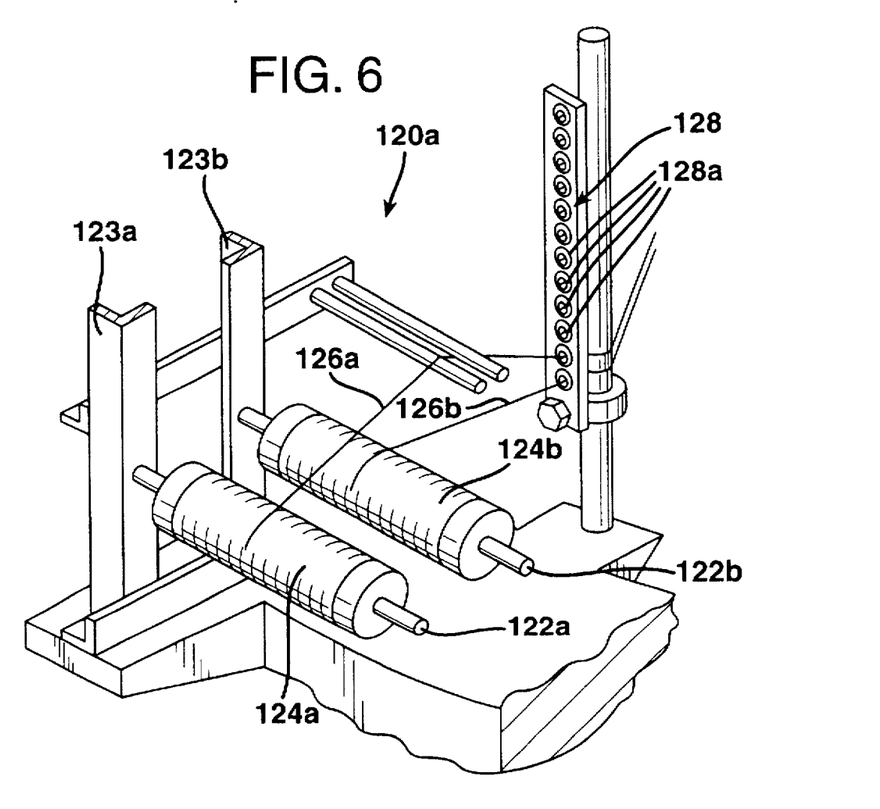
FIG. 6 is a perspective view of a portion of a modified creel constructed in accordance with a second embodiment of the present invention.
Figure 7:
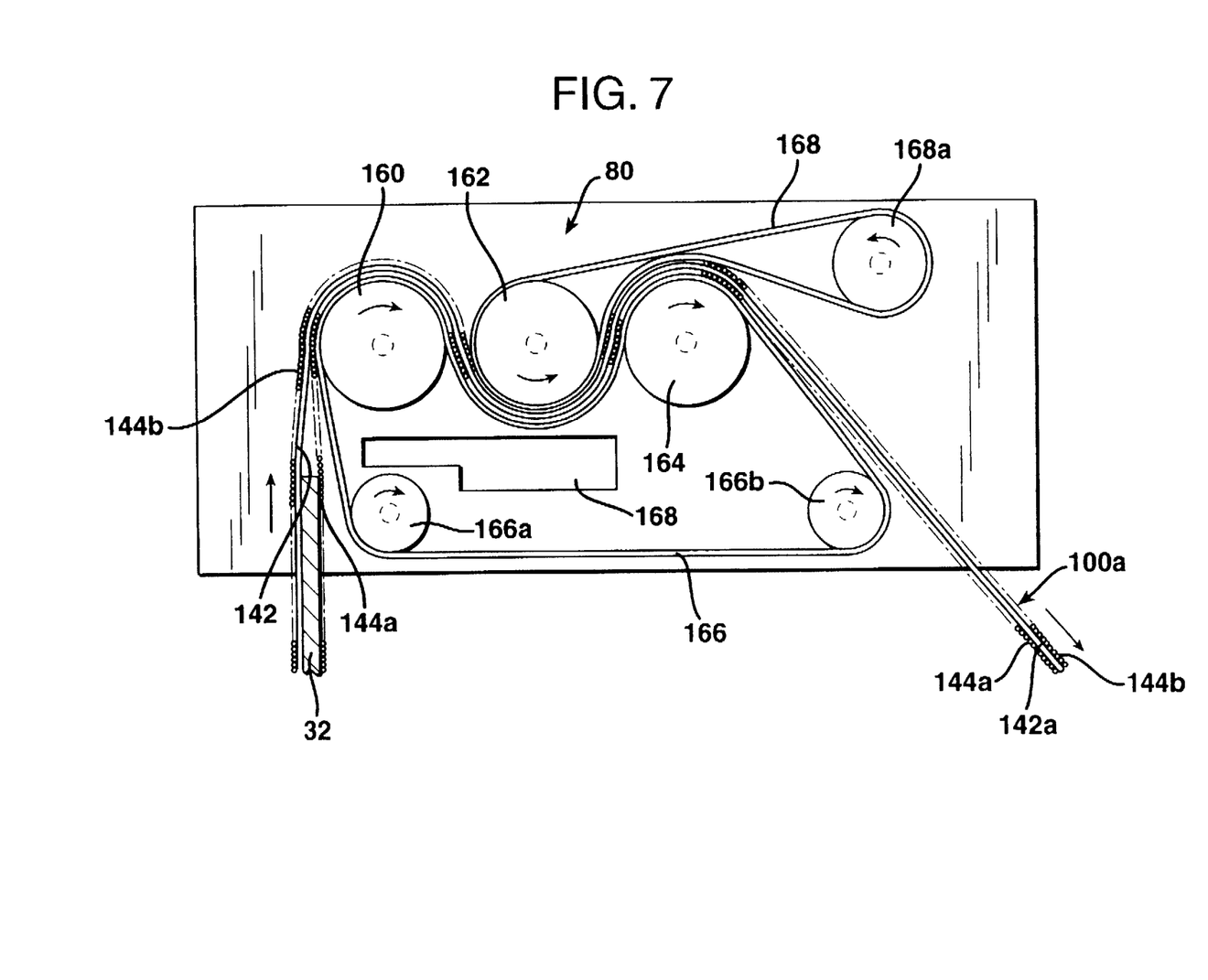
FIG. 7 is a side view, partially in section, of combining apparatus of the forming apparatus illustrated in FIG. 1 and showing upper and lower strand layers and an intermediate polymeric material layer interposed therebetween passing through the combining apparatus.

In an alternative embodiment illustrated in FIG. 6, each creel 120a comprises first and second spaced apart vertical supports 123a and 123b having a plurality of first and second horizontal support arms 122a and 122b for supporting first and second rows of packages 124a and 124b (only one first arm 122a and one second arm 122b are shown in FIG. 6). Eight first support arms 122a and eight second support arms 122b may be provided for supporting a total of sixteen packages at each creel 120a. The strands 126a extending from the first packages 124a, which packages 124a are spaced the greatest distance from the form 30, extend through a pair of the guide arms 129 so as not to contact the second package 124b positioned next to it. The strands 126a and 126b from the two adjacent packages 124a and 124b extend through eyelets 128a provided in the eyelet guide device 128 and then to the form 30.

It is further contemplated by the present invention that the packages 124 could comprise warp beams, i.e., spools with flanges, with each spool having a plurality of strands, e.g., 10 to 1000 strands. Such warp beams would be used in place of the single strand packages 124 shown in the illustrated embodiment. Thus, each creel 120 may only comprise one or two package support arms 122. Further, two to twelve warp beams located on a like number of creels spaced about the base 52 could be used. It is also contemplated that the eyelet guide device could comprise a ring-shaped eye-board (not shown) having a plurality of eyelets extending completely through the eye-board and arranged in rows which extend completely around the eye-board. Any other equivalent strand guide device could also be used in place of the illustrated device 128.

During operation of the apparatus 10, the motor 60 causes the carousel 50 and the cables 42a and 42b to move continuously. As the carousel 50 rotates about the form 30, the strands 20 extending from the packages 124 are wrapped about the form 30 and the cables 42a and 42b and are moved by the cables 42a and 42b upwardly along the form 30 and away from the form 30 to the combining station 80 where the wrapped strands 20 are joined together to form a mat 100, see FIG. 1.

Figure 5:
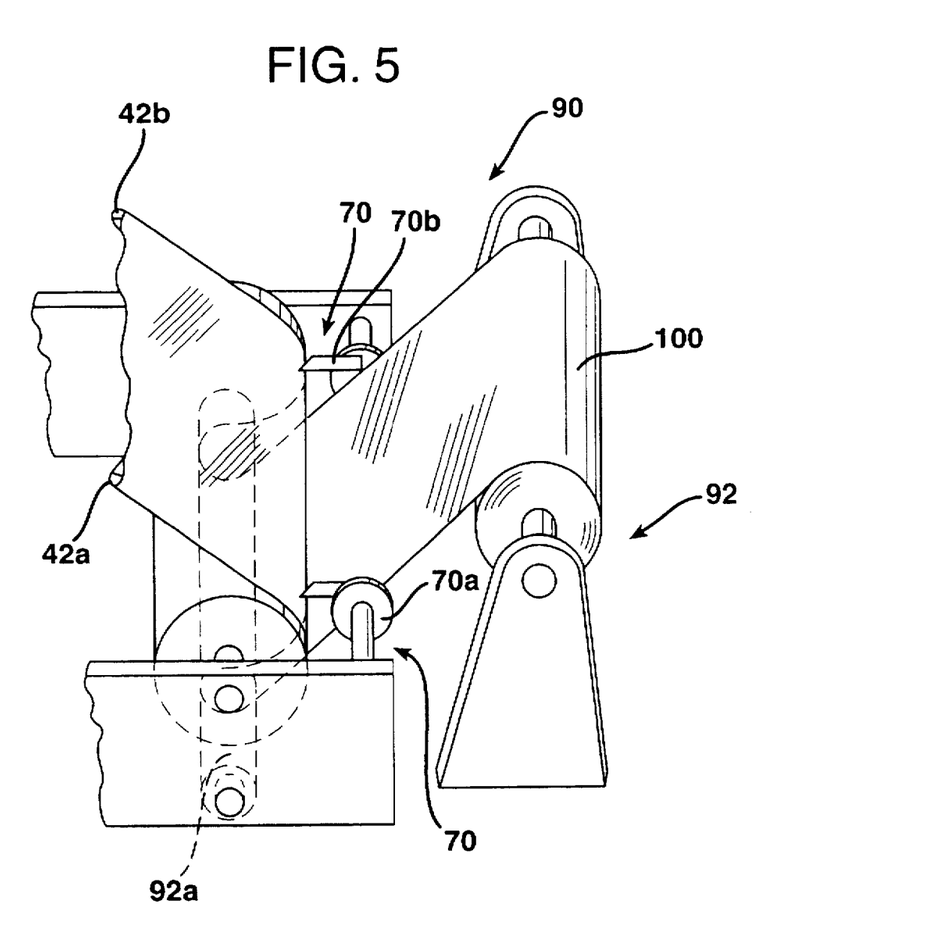
FIG. 5 is a perspective view of separating apparatus and a winder of the apparatus of the present invention.

The cables 42a and 42b then move the mat 100 to a separating station 90 where the mat 100 is cut from the cables 42a and 42b, see FIG. 5.

In FIGS. 1–3, strands 20a–20c are shown extending respectively from creels 120a–120c to the cable 42b where first portions 146a–146c of the strands 20a–20c frictionally engage the cable 42b. The first portions 146a–146c are vertically spaced from one another along the cable 42b, see FIG. 3. This vertical spacing between the strands 20a–20c results because the first portion 146a of the strand 20a engages the moving cable 42b before the first portions 146b and 146c of the strands 20b and 20c engage the cable 42b and the first portion 146b of the strand 20b engages the moving cable 42b before the first portion 146c of the strand 20c. Once the carousel 50 has moved sufficiently in a counterclockwise direction, which direction is indicated by arrow 200 in FIG. 2, second portions of the strands 20a–20c will frictionally engage the cable 42a and those second portions will be vertically spaced from one another along the cable 42a and will also be spaced vertically downwardly from their respective first portions 146a–146c.

It should be noted that in the illustrated embodiment, the ratio of the speed of the cables 42a and 42b to the speed of the carousel 50 is fixed. As such, all of the strands 20 will make initial contact with the first and second cables 42a and 42b at locations on the cables 42a and 42b which are generally positioned adjacent to the same defined lower portions 132c and 132d of the first and second sections 34a and 34b of the form 30, see FIG. 4.

Figure 4:
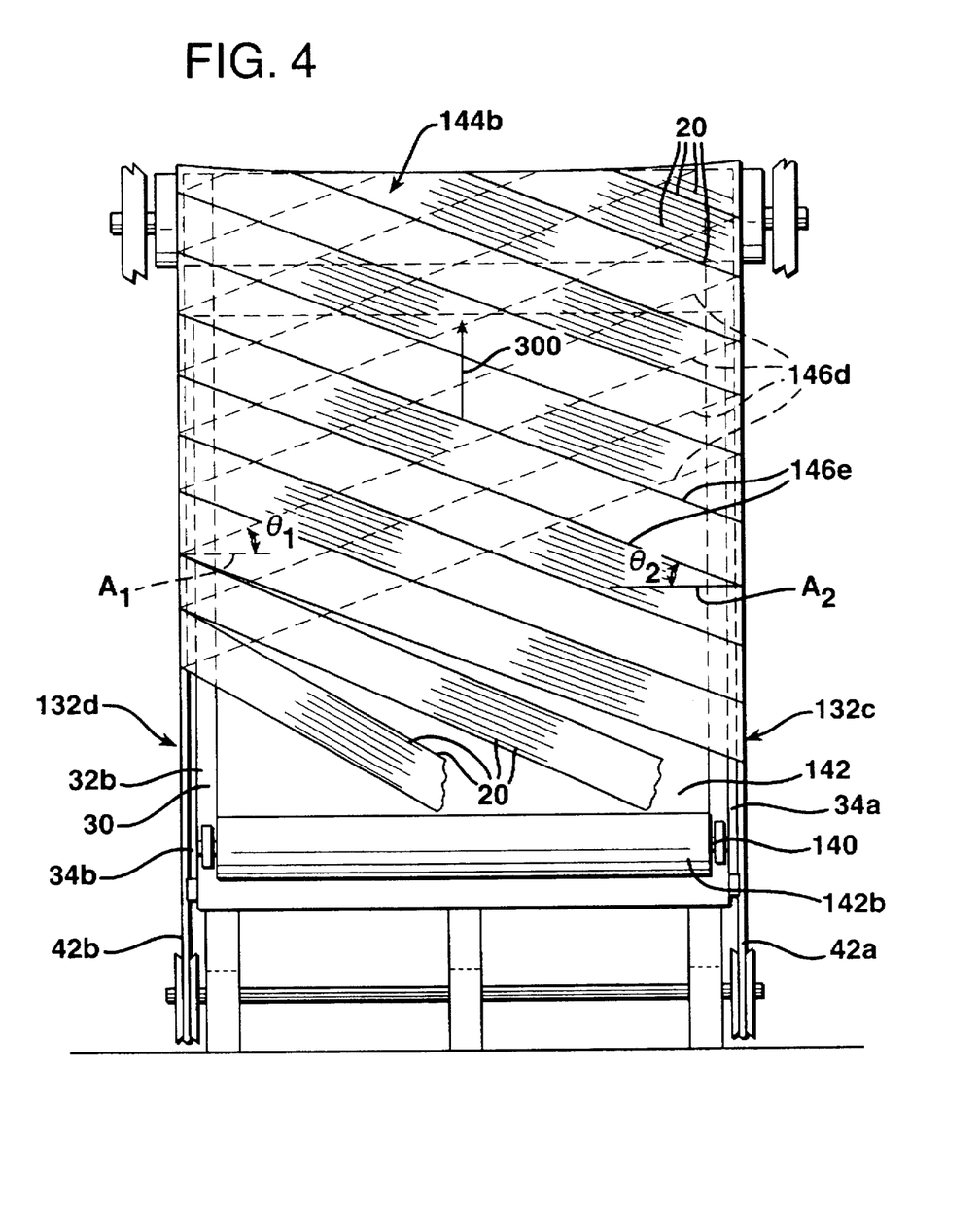
FIG. 4 is a front view of the apparatus shown in FIG. 1 but with the strand dispensing frame removed.

The strands 20 are wrapped about the plate 32 such that first intermediate portions 146d of the strands 20 extend across the first side 32a of the plate 32 and form an angle $\Theta_1$ with a horizontal axis $A_1$ extending across the first side 32a of the plate 32, see FIG. 4. Preferably, the angle $\Theta_1$ is from about 3° to about 87° and, more preferably, from about 30° to about 60°. Second intermediate portions 146e of the strands 20 extend across the second side 32b of the plate 32 and form an angle $\Theta_2$ with a horizontal axis $A_2$ extending across the second side 32b of the plate 32. Preferably, the angle $\Theta_2$ is from about −3° to about −87° and, more preferably, from about −30° to about −60°. In FIG. 4, $\Theta_1$ is approximately 21° and $\Theta_2$ is approximately −21°.

In accordance with a first embodiment of the present invention, illustrated in FIGS. 1, 4, 7 and 9, a layer of polymeric film material 142 is interposed between opposing layers 144a and 144b of the wrapped strands 20. The first layer 144a of the wrapped strands 20, comprised of the intermediate portions 146d, is positioned adjacent to the first side 32a of the plate 32, and the second layer 144b of the wrapped strands 20, comprised of the intermediate portions 146e, is positioned adjacent to the second side 32b of the plate 32. A fixed support 140 is provided adjacent to the plate 32 for supporting the roll 142b of polymeric film material 142, see FIGS. 1 and 4. The film material 142 is threaded between the second side 32b of the plate 32 and the second outer layer 144b of the strands 20. The film 142 moves upwardly with the second outer layer 144b and enters into the combining station 80 with the first and second layers 144a and 144b.

First, second and third rolls 160, 162 and 164 are provided at the combining station 80. A conventional radiant heater 168 is provided below the first and second rolls 160 and 162 for heating the first and second rolls 160 and 162. Conventional water cooling means (not shown) is associated with the third roll 164 for cooling same. The film material 142 and the first and second layers 144a and 144b of the wrapped strands 20 pass over the first heated roll 160, under the second heated roll 162 and over the chilled roll 164, see FIG. 7. The heated rolls 160 and 162 sufficiently soften or melt the film material 142 to bond together the strands 20 of the first and second layers 144a and 144b. The cooled roll 164 causes the softened or melted polymeric material to harden or solidify. The bonded strands form a mat 100a having outer strand layers 144a and 144b with polymeric material 142a interposed therebetween, see FIG. 9.

Also provided at the combining station 80 are first and second Teflon® webs 166 and 168. The first web 166 extends about the first, second and third rolls 160, 162 and 164 and idler rolls 166a and 166b. The second web 168 extends about the second and third rolls 162 and 164 and an idler roll 168a. The webs 166 and 168 form protective layers between the rolls 160, 162 and 164 and the first and second strand layers 144a and 144b and the film 142 to prevent the film 142 from adhering to the rolls 160, 162 and 164.

Figure 8:
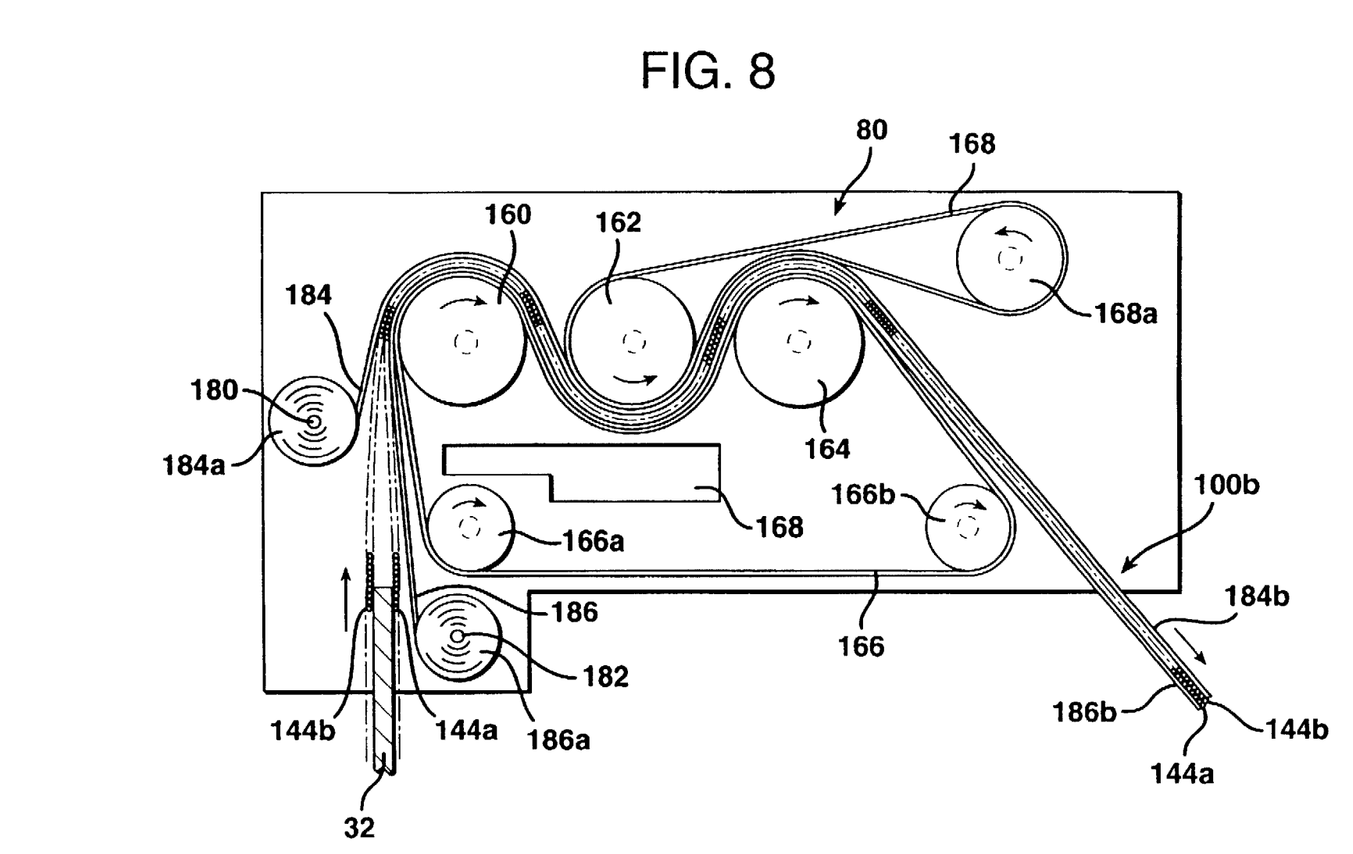
FIG. 8 is a view similar to FIG. 7 but showing two strand layers interposed between two polymeric film layers.
Figure 9:
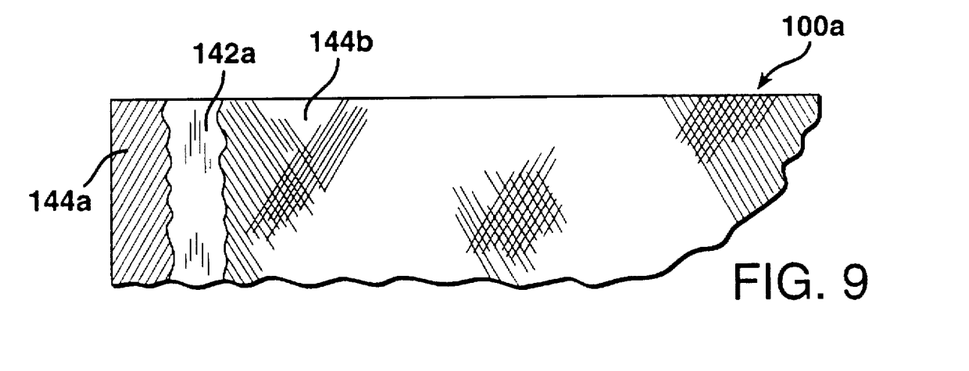
FIG. 9 is a top view of a section of a mat formed in accordance with a first embodiment of the present invention comprising upper and lower strand layers which are adhered to one another via a polymeric material layer with the top strand layer and the intermediate polymeric layer partially removed.
Figure 10:
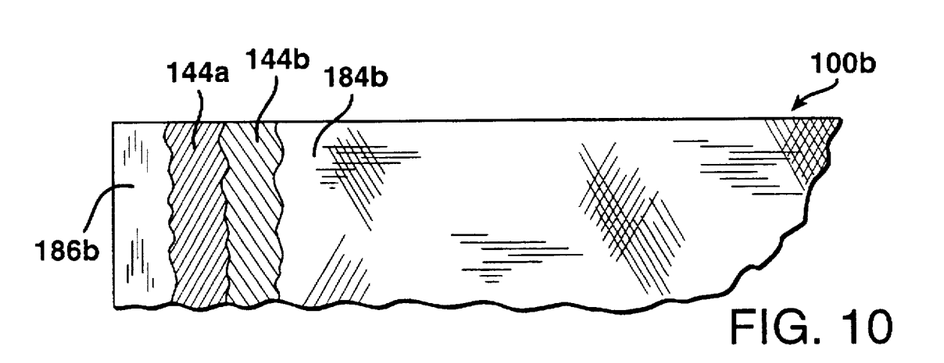
FIG. 10 is a top view of a section of a mat formed in accordance with a second embodiment of the present invention comprising intermediate strand layers and upper and lower polymeric material layers with the top and intermediate layers partially removed.

In accordance with a second embodiment of the present invention, first and second fixed supports 180 and 182 are provided adjacent to the combining station 80 for supporting first and second rolls 184a and 186a of polymeric film material 184 and 186, see FIG. 8. The two films 184 and 186 are combined with the first and second layers 144a and 144b of the wrapped strands 20 such that the films 184 and 186 are positioned on outer surfaces of the layers 144a and 144b. The films 184 and 186 and the first and second layers 144a and 144b of the wrapped strands 20 pass over the first heated roll 160, under the second heated roll 162 and over the chilled roll 164, see FIG. 8. The heated rolls 160 and 162 sufficiently soften or melt the film material 184 and 186 to bond together the strands 20 of the first and second layers 144a and 144b. The cooled roll 164 causes the softened or melted polymeric material to harden or solidify. The bonded strands form a mat 100b comprising inner strand layers 144a and 144b and polymeric material outer layers 184b and 186b, see FIG. 10.

Examples of suitable polymeric film materials 142, 184 and 186 include polyamide films, polypropylene films, polyester films, polyethylene films, polyphenylene sulfide films or any other thermoplastic film.

The strands 20 of material preferably comprise strands of continuous reinforcing fibers such as glass fibers (e.g., S-glass or E-glass), synthetic fibers and/or any other suitable reinforcing fibers. The synthetic fibers may comprise fibers formed from materials such as Kevlar®, carbon or graphite, a metallic or ceramic material, and other non-glass manmade materials having suitable reinforcing characteristics. It is also contemplated that the strands of material 20 may comprise non-reinforcing fibers formed, for example, from a polymeric material.

In accordance with a third embodiment of the present invention, the strands of material 200a comprise composite material strands such as the commingled reinforcing and polymer fiber strands disclosed in U.S. patent application Ser. No. 08/311,817., filed on Sep. 26, 1994, and entitled "METHOD AND APPARATUS FOR FORMING COMPOSITE STRANDS," the disclosure of which is incorporated herein by reference. The reinforcing fibers used in the commingled strands 200a may comprise glass fibers or synthetic fibers, such as those discussed above. The polymer fibers may be selected from the group consisting of polyamide fibers, polypropylene fibers, polyester fibers, polyethylene fibers and polyphenylene sulfide fibers. The polymer fibers may also comprise fibers formed from any other fiberizable polymeric material. It is also contemplated that the composite material strands 200a may comprise reinforcing fibers having a polymeric material such as a solvent free chemical treatment coated thereon or reinforcing and matrix fibers having a polymeric material such as a solvent free chemical treatment coated thereon such as those disclosed in copending U.S. patent application Ser. No. 08/695,909, filed on Aug. 12, 1996, and entitled "CHEMICAL TREATMENTS FOR FIBERS AND WIRE-COATED COMPOSITE STRANDS FOR MOLDING FIBER-REINFORCED THERMOPLASTIC COMPOSITE ARTICLES," by Andrew B. Woodside, and in copending U.S. patent application Ser. No. 08/695,504, filed on Aug. 12, 1996, and entitled "CHEMICAL TREATMENTS FOR FIBERS AND WIRE-COATED COMPOSITE STRANDS FOR MOLDING FIBER-REINFORCED THERMOPLASTIC COMPOSITE ARTICLES," by Andrew B. Woodside, the disclosures of which are incorporated herein by reference.

Figure 11:
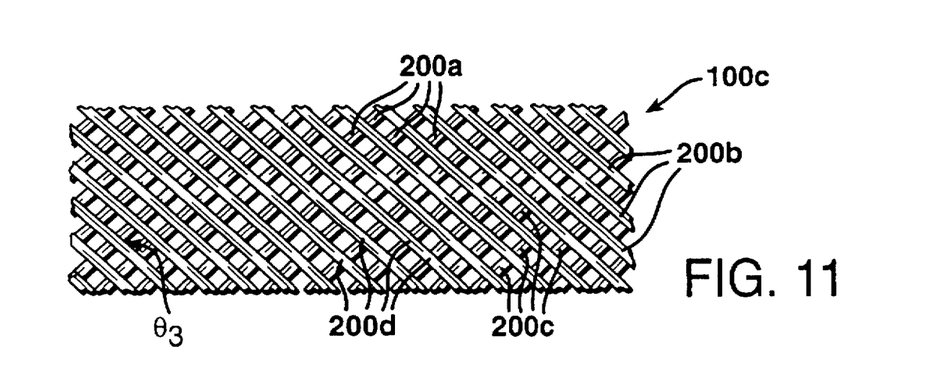
FIG. 11 is a top view of a section of a mat formed in accordance with a third embodiment of the present invention comprising crossing composite strands adhered to one another.

In FIG. 11, a mat 100c formed from composite strands 200a is shown. The polymeric material incorporated into the composite strands 200a provides the bonding mechanism for the mat 100c. Thus, as the strands 200a pass over and under rolls 160 and 162, the polymeric material incorporated into the strands 200a sufficiently softens or melts such that adjacent strand portions 200b and 200c bond or fuse to one another at points 200d where the adjacent strand portions 200b and 200c cross one another. The bonded strand portions 200b and 200c form the mat 100c. The cooled roll 164 causes the softened or melted polymeric material to harden or solidify. As can be seen from FIG. 11, the strand portions 200b are positioned at an angle $\Theta_3$ relative to the strand portions 200c. The angle between any two strand portions 200b and 200c is from about 6° to about 174° and, more preferably, from about 60° to about 120°. It is also contemplated that one or more polymeric material film layers may be combined with the composite strands 200a in forming a mat.

The separating apparatus 70 may comprise first and second cutting blades 70a and 70b for cutting outer edge portions of the mat 100 adjacent to the cables 42a and 42b, see FIG. 5. The cut mat 100 is then wound into a package via a conventional winder device 92 after first passing under an idler roller 92a.

In the illustrated embodiment, the speed of the carousel 50 is fixed relative to the speed of the cables 42a and 42b via the gearing arrangement provided. The angles $\Theta_1$ and $\Theta_2$, shown in FIG. 4, can be varied by changing the ratio of the carousel speed to that of the cable speed. This can be achieved by substituting a different gearing arrangement for the one provided so as to achieve the desired speed ratio between the carousel 50 and the cables 42a and 42b. It is also contemplated that separate drives for the cables 42a and 42b and the carousel 50 may be provided, such as conventional servo-motors, such that the speed ratio can be changed via the processor controlling those servo-motors.

The weight of the mat can be changed by varying the angles $\Theta_1$ and $\Theta_2$, varying the number of strands 20 used and/or changing the weight and size of the strands 20 used. To vary the spacing between the strands 200 in the mat 100, the angles $\Theta_1$ and $\Theta_2$ are varied and/or the number of strands 20 provided is changed.

Alternatively, the carousel 50 could rotate in a clockwise direction. As such, angle $\Theta_1$ of strand portions 146d is from about −3° to about −87° and angle $\Theta_2$ of strand portions 146e is from about 3° to about 87°.

It is further contemplated that reinforcing fibers (not shown) could be provided which are located in the machine direction, designated by arrow 300 in FIG. 4, which is generally parallel to a longitudinal axis of the form 30. It is also contemplated that polymer strands formed from a polymeric material such as one of the materials set out above from which the film material 142 is formed, could run in the machine direction 300 and could be used in place of or in addition to the film materials 142, 184, 186. It is additionally contemplated that commingled reinforcing and polymer fiber strands or reinforcing fibers coated with a polymeric material could be positioned in the machine direction 300 and used in place of or in addition to the film materials 142, 184 and 186. It is still further contemplated that film material, polymer fibers, commingled reinforcing and polymer fiber strands and/or polymer coated reinforcing fibers having polymeric material with a melting temperature below the melting temperature of polymeric material incorporated into composite strands wrapped about the form 30 could be provided such that they run in the machine direction 300. As such, the polymeric material of the film material, polymer fibers, commingled reinforcing and polymer fiber strands and/or polymer coated reinforcing strands would soften or melt in the combining station 80 to bond together the wrapped composite strands without the polymeric material in the wrapped composite strands melting.

Having described the invention in detail and by reference to preferred embodiments thereof, it will be apparent that modifications and variations are possible without departing from the scope of the invention defined in the appended claims.

What is claimed is:

1. A mat for use as a reinforcement in a composite product comprising:

a plurality of composite strands each including reinforcing fibers and first polymeric material; and second polymeric material engaging said composite strands, wherein first portions of said strands are angularly positioned relative to second portions of said strands and are joined to said second portions via said second polymeric material.

2. A mat as set forth in claim 1, wherein said second polymeric material comprises a polymeric film material.

3. A mat as set forth in claim 1, wherein said second polymeric material comprises polymer fibers.

4. A mat as set forth in claim 3, wherein said polymer fibers are selected from the group consisting of polyamide fibers, polypropylene fibers, polyester fibers, polyethylene fibers, and polyphenylene sulfide fibers.

5. A mat as set forth in claim 1, wherein said second polymeric material comprises polymer fibers incorporated into commingled glass and polymer fiber strands.

6. A mat as set forth in claim 5, wherein said polymer fibers are selected from the group consisting of polyamide fibers, polypropylene fibers, polyester fibers, polyethylene fibers and polyphenylene sulfide fibers.

7. A mat as set forth in claim 1, wherein said second polymeric material has a melting temperature which is generally below the melting temperature of said first polymeric material.

8. A mat as set forth in claim 1, wherein said first strand portions form with a first horizontal axis an angle of from about 3° to about 87° and said second strand portions form with a second horizontal axis parallel to the first horizontal axis an angle of from about −3° to about −87°.

* * * * *